(12) United States Patent  
Toyoda et al.

(10) Patent No.: US 8,835,254 B2  
(45) Date of Patent: Sep. 16, 2014

(54) SEMICONDUCTOR DEVICE MANUFACTURING METHOD

(71) Applicant: Fuji Electric Co., Ltd., Kawasaki (JP)

(72) Inventors: Yoshiaki Toyoda, Matsumoto (JP); Takatoshi Ooe, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

(21) Appl. No.: 14/079,259

(22) Filed: Nov. 13, 2013

(65) Prior Publication Data

US 2014/0073102 A1 Mar. 13, 2014

Related U.S. Application Data

(63) Continuation of application No. PCT/JP2012/065923, filed on Jun. 21, 2012.

(30) Foreign Application Priority Data

Jun. 30, 2011 (JP) ................. 2011-145884

(51) Int. Cl.
| | |
|---|---|
| *H01L 21/336* | (2006.01) |
| *H01L 21/8238* | (2006.01) |
| *H01L 27/092* | (2006.01) |
| *H01L 29/40* | (2006.01) |
| *H01L 27/108* | (2006.01) |
| *H01L 29/739* | (2006.01) |
| *H01L 21/8242* | (2006.01) |
| *H01L 29/66* | (2006.01) |
| *H01L 29/78* | (2006.01) |

(52) U.S. Cl.  
CPC .. *H01L 29/66666* (2013.01); *H01L 21/823807* (2013.01); *H01L 29/66734* (2013.01); *H01L 29/66659* (2013.01); *H01L 29/7395* (2013.01); *H01L 27/0922* (2013.01); *H01L 21/823885* (2013.01); *H01L 29/402* (2013.01); *H01L 21/823828* (2013.01); *H01L 29/7811* (2013.01)  
USPC .................. 438/259; 438/270; 257/E27.091; 257/E29.201; 257/E21.655

(58) Field of Classification Search  
None  
See application file for complete search history.

(56) References Cited

U.S. PATENT DOCUMENTS 6,323,518 B1 11/2001 Sakamoto et al.  
2003/0132460 A1* 7/2003 Tabuchi et al. ............... 257/213

(Continued)

FOREIGN PATENT DOCUMENTS

JP 06-151728 A 5/1994  
JP 2000-022140 A 1/2000

(Continued)

*Primary Examiner* — Calvin Choi  
(74) *Attorney, Agent, or Firm* — Rossi, Kimms & McDowell, LLP

(57) ABSTRACT

A method of forming a device in each of vertical trench gate MOSFET region and control lateral planar gate MOSFET region of a semiconductor substrate is disclosed. A trench is formed in the substrate in the vertical trench gate MOSFET region, a first gate oxide film is formed along the internal wall of the trench, and the trench is filled with a polysilicon film. A LOCOS oxide film is formed in a region isolating the devices. A second gate oxide film is formed on the substrate in the lateral planar gate MOSFET region. Advantages are that number of steps is suppressed, the gate threshold voltage of an output stage MOSFET is higher than the gate threshold voltage of a control MOSFET, the thickness of the LOCOS oxide film does not decrease, and no foreign object residue remains inside the trench.

8 Claims, 15 Drawing Sheets

(56) References Cited

U.S. PATENT DOCUMENTS

| | | | |
|---|---|---|---|
| 2007/0096204 A1 | 5/2007 | Shiratake | |
| 2007/0138566 A1 | 6/2007 | Suzuki et al. | |
| 2009/0085109 A1* | 4/2009 | Izumi | 257/334 |
| 2009/0114980 A1* | 5/2009 | Pang | 257/328 |
| 2010/0025759 A1* | 2/2010 | Yoshimochi | 257/330 |

FOREIGN PATENT DOCUMENTS

| | | |
|---|---|---|
| JP | 2000-091344 A | 3/2000 |
| JP | 2002-141501 A | 5/2002 |
| JP | 2002-184980 A | 6/2002 |
| JP | 2003-249650 A | 9/2003 |
| JP | 2003-264289 A | 9/2003 |
| JP | 2004-134666 A | 4/2004 |
| JP | 2004-253470 A | 9/2004 |
| JP | 2007-027556 A | 2/2007 |
| JP | 2007-123551 A | 5/2007 |
| JP | 2007-165797 A | 6/2007 |
| JP | 2008-021811 A | 1/2008 |
| JP | 2009-099955 A | 5/2009 |
| JP | 2009-117828 A | 5/2009 |
| WO | 2013002129 A1 | 1/2013 |

* cited by examiner

US 8,835,254 B2

SEMICONDUCTOR DEVICE MANUFACTURING METHOD

BACKGROUND OF THE INVENTION

A. Field of the Invention

The present invention relates to a method of manufacturing a semiconductor device, such as a vertical trench gate power IC, wherein a vertical trench gate semiconductor device and planar gate semiconductor device are formed on the same semiconductor substrate.

B. Description of the Related Art

A vertical semiconductor device (hereafter taken to be a trench gate MOS semiconductor device) in which a MOS gate (an insulated gate formed from a metal-oxide film-semiconductor) region is formed inside a trench has been proposed as a semiconductor device that realizes a reduction in on-state resistance and a reduction in area. A vertical semiconductor device is a device such that current flows from the front surface toward the rear surface, or from the rear surface toward the front surface, of a semiconductor substrate on which the device is formed. That is, it is a device in which current flows in the depth direction of the semiconductor substrate. Also, a semiconductor device (hereafter taken to be a vertical trench gate power IC) in which a vertical trench gate MOS semiconductor device is adopted as an output stage semiconductor device, and a control semiconductor device for controlling and protecting the output stage semiconductor device is formed aligned on the same semiconductor substrate, has been proposed as a vertical trench gate MOS semiconductor device that realizes increased reliability and increased destruction withstand at a low cost.

An example of a sectional configuration of main portions of a vertical trench gate power IC is shown in FIG. 6. FIG. 6 is a sectional view showing a configuration of a heretofore known vertical trench gate power IC. Vertical trench gate MOSFET (insulated gate field effect transistor) region 21 and lateral planar gate n-channel MOSFET region 22a are formed on the same semiconductor substrate in the vertical trench gate power IC. Vertical trench gate MOSFET region 21 is an active region of a vertical trench gate MOS semiconductor device, which is an output stage semiconductor device. Lateral planar gate n-channel MOSFET region 22a is a low breakdown voltage region in which is formed a lateral planar gate n-channel MOS semiconductor device, which is a control semiconductor device. Junction termination region 23 is formed in an outer peripheral portion enclosing vertical trench gate MOSFET region 21 and lateral planar gate n-channel MOSFET region 22a. Junction termination region 23 includes a field plate (metal wire 12f and polysilicon wire 6c) that alleviates electric field concentration that is liable to lead to breakdown at a low voltage.

The vertical trench gate power IC needs to have a relationship in which the gate threshold voltage of the MOSFET (hereafter referred to as the output stage MOSFET) formed as the output stage semiconductor device in vertical trench gate MOSFET region 21 is higher than the gate threshold voltage of the MOSFET (hereafter referred to as the control MOSFET) formed as the control semiconductor device in lateral planar gate n-channel MOSFET region 22a. The reason for this is to enable a protective function of the control MOSFET with respect to the output stage MOSFET. A description will be given, using vertical trench gate power IC 101 shown in the circuit block diagram of FIG. 7, of the necessity for this heretofore described relationship between the gate threshold voltage of the output stage MOSFET and the gate threshold voltage of the control MOSFET.

FIG. 7 is a circuit block diagram showing a configuration of a vertical trench gate power IC. Vertical trench gate power IC 101 is formed of output stage MOSFET 102 and control circuit unit 103. Control circuit unit 103 includes pull-down MOSFET (a control MOSFET) 107 and pull-down MOSFET 107 drive circuit 108. Normally, drive circuit 108 is configured of a MOSFET having the same characteristics as pull-down MOSFET 107. Also, the configuration is such that, as gate input terminal 104 of output stage MOSFET 102 and a power source terminal of control circuit unit 103 are in common, control circuit unit 103 operates with the input from gate input terminal 104 as power source voltage.

Typical functions of control circuit unit 103 include a function of protecting output stage MOSFET 102. That is, when an abnormal condition of output stage MOSFET 102, such as an overheat condition or overcurrent condition, is detected, control circuit unit 103 has a function of reducing the gate voltage of output stage MOSFET 102 to a ground potential by putting pull-down MOSFET 107 into an on-state, thereby cutting off the output current of output stage MOSFET 102 and preventing device destruction. In the circuit block of FIG. 7, reference sign 105 is a drain terminal, while reference sign 106 is a source terminal.

The relationship by which the gate threshold voltage of output stage MOSFET 102 is higher than the gate threshold voltage of the control MOSFET (pull-down MOSFET 107) is an effective means of solving the following problem. Hereafter, a description will be given regarding this point. The circuit configuration of the circuit block shown in FIG. 7 is such that, when the gate input voltage falls to or below the gate threshold voltage of pull-down MOSFET 107, pull-down MOSFET 107 stops operating. Because of this, by fixing (pulling down) the gate of output stage MOSFET 102 to the ground potential, it is no longer possible to cut off the current.

Also, as drive circuit 108 is also configured of a MOSFET having the same characteristics as pull-down MOSFET 107, drive circuit 108 stops operating, in the same way as pull-down MOSFET 107, and the function of cutting off the current to output stage MOSFET 102 is disabled. Because of this, the gate input voltage is applied to the gate of output stage MOSFET 102 in a condition in which the protective function of control circuit unit 103 is disabled. In the event that the gate threshold voltage of output stage MOSFET 102 is lower than the gate input voltage at this time, output stage MOSFET 102 is maintained in an on-state. In the event that the vertical trench gate power IC falls into an abnormal condition under these kinds of condition, the protective function is not enabled, and the possibility of device destruction increases.

Meanwhile, provided that the relationship in which the gate threshold voltage of output stage MOSFET 102 is higher than the gate threshold voltage of the control MOSFET is established, then even when the gate input voltage to the control MOSFET drops to the extent that the protective function is disabled, the gate input voltage to output stage MOSFET 102 also simultaneously falls to or below the gate threshold voltage of output stage MOSFET 102. Consequently, as output stage MOSFET 102 is maintained in an off-state, and the output current of output stage MOSFET 102 is cut off, it is possible to avoid device destruction caused by an abnormal output current.

Next, a description will be given of a problem when a CMOS (Complementary Metal Oxide Semiconductor) is adopted as the control MOSFET. Adopting a CMOS as the control MOSFET is useful in improving the performance of the control circuit unit 103, such as by reducing circuit current consumption. When configuring control circuit unit 103 with a CMOS, the minimum operating power source voltage of the drive circuit 108 is higher than when adopting a circuit configuration of only a lateral n-channel MOSFET as control circuit unit 103.

However, when adopting a CMOS as the control MOSFET, the following kind of problem occurs. When the gate input voltage falls to or below the gate threshold voltage of the control MOSFET, as heretofore described, it is necessary to provide vertical trench gate power IC 101 with a function whereby drive circuit 108 is prevented from stopping operating before output stage MOSFET 102. When adopting a CMOS as the control MOSFET, a lateral n-channel MOSFET and lateral p-channel MOSFET are provided as the control MOSFET. Because of this, in addition to the gate threshold voltage of the lateral n-channel MOSFET, it is necessary that the gate threshold voltage (absolute value) of the lateral p-channel MOSFET also falls to or below the gate threshold voltage of output stage MOSFET 102.

The following two methods are known as methods of realizing a desirable relationship between the gate threshold voltages of the output stage MOSFET and control MOSFET (CMOS) in the heretofore described kind of vertical trench gate power IC by adapting the chip manufacturing process.

The first method is a method whereby the gate threshold voltage of the control MOSFET is reduced by forming a diffusion layer having a conductivity type the opposite of that of a well region, at a concentration lower than that of the well region, in a layer below a gate electrode of the control MOSFET. However, the first method is such that it is necessary to add a step of carrying out an ion implantation of a low dose of a dopant of a conductivity type the opposite of that of the well region in order to form the diffusion layer having a conductivity type the opposite of that of the well region in the layer below the gate electrode of the control MOSFET. That is, an ion implantation step for adjusting the gate threshold voltage of the control MOSFET is added.

According to the first method, as the surface concentration of a control MOSFET channel formation region decreases, and a control MOSFET channel can easily be formed at a low gate voltage, it is possible to reduce the gate threshold voltage of the control MOSFET. Consequently, by selecting appropriate ion implantation conditions such that the gate threshold voltage of the control MOSFET falls to or below the gate threshold voltage of the output stage MOSFET, it is possible to realize the previously described desirable relationship between the gate threshold voltages of the output stage MOSFET and control MOSFET. However, the first method is such that it is necessary to selectively carry out the previously described gate threshold voltage adjusting ion implantation for each of the lateral n-channel MOSFET and lateral p-channel MOSFET configuring the CMOS. Consequently, there is a problem in that the number of steps increases, and the cost rises.

The second method is a method whereby the gate threshold voltage of the control MOSFET is reduced by a second gate oxide film of the control MOSFET being thinner than a first gate oxide film of the output stage MOSFET so that the control MOSFET channel is easily formed at a lower voltage. According to the second method, it is possible to simultaneously lower the gate threshold voltage of each of the lateral n-channel MOSFET and lateral p-channel MOSFET simply by carrying out the one step of forming the thin second gate oxide film of the control MOSFET. From this aspect, the second method is preferable to the first method.

As the desirable relationship between the gate threshold voltages of the output stage MOSFET and control MOSFET, that is, the relationship by which the gate threshold voltage of the output stage MOSFET is higher than the gate threshold voltage of the control MOSFET, is established in a vertical trench gate power IC in which a CMOS is adopted as the control circuit unit, as heretofore described, it is preferable that the second method is employed.

The following method has been proposed with regard to a method of manufacturing this kind of vertical trench gate power IC. Firstly, an isolation region is formed of a LOCOS oxide film (selective oxide film) on the front surface of a semiconductor substrate. Next, a trench is formed, and an output stage MOSFET trench gate structure is formed by a polysilicon film formation and an etching back of the polysilicon film being carried out sequentially. Next, after well regions configuring a lateral n-channel MOSFET and lateral p-channel MOSFET of a CMOS are formed on the front surface of the semiconductor substrate, a control MOSFET CMOS gate structure is formed by a thermal oxidation and polysilicon film formation being carried out sequentially (for example, refer to PTL 1 and 2 described below).

Also, with regard to a method of manufacturing the previously described kind of vertical trench gate power IC, there has been proposed a method in which, after a trench is formed in a semiconductor substrate, an oxide film is formed along the internal wall of the trench, and the oxide film above the CMOS region is removed with the resist covering the trench as a mask (for example, refer to PTL 3 described below).

However, when manufacturing a semiconductor device including a plurality of semiconductor devices, like the vertical trench gate power IC, using the second method for realizing the desirable relationship between the gate threshold voltages of the output stage MOSFET and control MOSFET of the vertical trench gate power IC in the manufacturing process, a LOCOS oxide film (selective oxide film) necessary for device isolation is formed, because of which the kinds of problem described below occur. Although there is little increase in the thickness of the LOCOS oxide film even after passing through a gate oxide film formation step, the LOCOS oxide film has a property such that the etching speed of the LOCOS oxide film is no different from the etching speed of the gate oxide film. Because of this, the thickness of the LOCOS oxide film decreases every time the gate oxide film formation and pattern-etching are repeated.

The decrease in the thickness of the LOCOS oxide film leads to a drop in the gate threshold voltage of an inter-device parasitic field MOSFET. As a result of this, an inversion layer is liable to be formed below the LOCOS oxide film in a device isolation region due to the potential of a metal electrode film and polysilicon wire disposed on the LOCOS oxide film, causing adverse effects such as a drop in inter-device isolation capability. Furthermore, as the LOCOS oxide film formed in the control lateral planar gate MOSFET region also has a function of alleviating electrical field concentration, thereby maintaining breakdown voltage, there is a problem in that the breakdown voltage drops due to the decrease in the thickness of the LOCOS oxide film. Consequently, taking the decrease in the thickness of the LOCOS oxide film into account, it is necessary to form the LOCOS oxide film in the device isolation region to a thickness greater than the desired thickness in advance. This is not desirable when considering the aspects of production throughput and cost.

Furthermore, the second method has the processing problems described below. Of the manufacturing steps, a step of partially removing only the control MOSFET portions of the gate oxide film formed over the whole of the front surface of the semiconductor substrate is such that the gate oxide film on the internal wall of the trench is covered with the resist in a condition in which the trench is opened (a condition in which nothing is embedded inside), and a photolithography step of removing the gate oxide film formed on the front surface of the semiconductor substrate is carried out with the resist as a mask. Because of this, the resist enters into the narrow, deep trench, and a problem occurs in that exposure of the resist that has entered to the bottom portion of the trench, and removal of the resist, is difficult. The further processing accuracy increases, and the narrower the trench becomes, the more pronounced and serious the problem becomes. Also, it is also difficult to clean sufficiently inside the trench in a subsequently carried out cleaning step, and there is concern that trench gate reliability will decrease due to the adherence of foreign objects, or the like.

The present invention is directed to overcoming or at least reducing the effects of one or more of the problems set forth above.

SUMMARY OF THE INVENTION

In order to solve the heretofore described problems with the heretofore known technology, the invention provides a semiconductor device manufacturing method in which an increase in the number of steps is suppressed, a relationship wherein the gate threshold voltage of an output stage MOS semiconductor device is higher than the gate threshold voltage of a control MOS semiconductor device is satisfied, and the thickness of a LOCOS oxide film in an device isolation region does not decrease. Also, in order to solve the heretofore described problems with the heretofore known technology, the invention provides a semiconductor device manufacturing method whereby it is possible to satisfy the heretofore described gate threshold voltage relationship, and to eliminate the residue of foreign objects inside a trench.

In order to solve the heretofore described problems, a semiconductor device manufactured using a semiconductor device manufacturing method according to the invention includes a main semiconductor device portion having a first first conductivity type semiconductor region formed on a first main surface side of a first conductivity type semiconductor substrate, a second conductivity type semiconductor region selectively formed in a surface layer on a second main surface side of the first conductivity type semiconductor substrate, a second first conductivity type semiconductor region selectively formed in a surface layer of the second conductivity type semiconductor region, a trench penetrating from the surface of the second conductivity type semiconductor region through the second conductivity type semiconductor region and second first conductivity type semiconductor region and reaching the first conductivity type semiconductor substrate, a first gate oxide film formed along the internal wall of the trench, and a gate electrode formed on the first gate oxide film inside the trench. The semiconductor device further includes a device isolation portion, selectively formed on the surface on the second main surface side of the first conductivity type semiconductor substrate, that has a selective oxide film of a thickness greater than that of the first gate oxide film. The semiconductor device further includes a control semiconductor device portion that controls the main semiconductor device portion, having a second conductivity type well diffusion region formed in a surface layer of a portion on the second main surface side of the first conductivity type semiconductor substrate isolated from the main semiconductor device portion by the device isolation portion, a control gate electrode formed on a second gate oxide film on the surface of the second conductivity type well diffusion region, a first conductivity type control source region selectively formed in a surface layer of the second conductivity type well diffusion region, and a first conductivity type control drain region formed apart from the first conductivity type control source region in a surface layer of the second conductivity type well diffusion region, sandwiching a portion of the second conductivity type well diffusion region that opposes the control gate electrode. This kind of semiconductor device manufacturing method has the following characteristics. Firstly, a trench formation step of forming the trench in the second main surface of the first conductivity type semiconductor substrate is carried out. Next, a first gate oxide film formation step of forming the first gate oxide film along the internal wall of the trench is carried out. Then a gate electrode formation step of forming the gate electrode on the first gate oxide film inside the trench is carried out. Next, a selective oxide film formation step of selectively forming the selective oxide film on the second main surface of the first conductivity type semiconductor substrate is carried out. Then a second gate oxide film formation step of forming the second gate oxide film of a thickness less than that of the first gate oxide film on the second main surface of the first conductivity type semiconductor substrate is carried out. Next, a control gate electrode formation step of forming the control gate electrode on the second gate oxide film is carried out. The selective oxide film formation step is carried out as a step later than the trench formation step.

It is preferable that the heretofore described semiconductor device manufacturing method according to the invention is such that the selective oxide film formation step is carried out as a step later than the gate electrode formation step.

It also is preferable that the heretofore described semiconductor device manufacturing method according to the invention is carried out in the order of the trench formation step, first gate oxide film formation step, gate electrode formation step, selective oxide film formation step, second gate oxide film formation step, and control gate electrode formation step.

It also is preferable that the heretofore described semiconductor device manufacturing method according to the invention is such that the selective oxide film is a LOCOS oxide film.

The heretofore described semiconductor device manufacturing method according to the invention may be such that the gate electrode is formed by the trench being filled with polysilicon in the gate electrode formation step, the control gate electrode is formed by polysilicon being deposited on the second gate oxide film in the control gate electrode formation step, and the gate electrode formation step and control gate electrode formation step are the same step.

It is also preferable that the heretofore described semiconductor device manufacturing method according to the invention includes a vertical or lateral trench gate insulated gate field effect transistor in the main semiconductor device portion.

Also, the heretofore described semiconductor device manufacturing method according to the invention may include a vertical or lateral trench gate insulated gate bipolar transistor in the main semiconductor device portion.

The heretofore described semiconductor device manufacturing method according to the invention also may include a lateral planar gate insulated gate field effect transistor or lateral trench gate insulated gate field effect transistor in the control semiconductor device portion.

According to the invention, it is possible to independently set the thickness of the first gate oxide film and the thickness of the second gate oxide film, and to independently set the threshold voltage of each device, by carrying out the step of forming the first gate oxide film of the MOS semiconductor device (output stage MOS semiconductor device) formed in the main semiconductor device portion and the step of forming the second gate oxide film of the MOS semiconductor device (control MOS semiconductor device) formed in the control semiconductor device portion as isolated steps. Because of this, it is possible for the gate threshold voltage of the output stage MOS semiconductor device to be higher than the gate threshold voltage of the control MOS semiconductor device, while suppressing an increase in the number of steps, without carrying out a control MOS semiconductor device gate threshold voltage adjusting ion implantation step, as heretofore known.

According to the invention, it is possible, by carrying out the step of forming the selective oxide film after the step of forming the trench, to prevent the thickness of the selective oxide film from decreasing due to the etching for forming the trench. Consequently, it is possible to avoid problems such as a drop in the gate threshold voltage of the inter-device parasitic field MOSFET or a drop in the device breakdown voltage that occur because the selective oxide film is too thin. Also, according to the invention, it is possible to avoid carrying out the photolithography step in a condition in which there is nothing embedded in the trench by carrying out the step of forming the selective oxide film after the step of forming the gate electrode, and thus possible to adopt manufacturing steps such that the resist does not enter the trench.

According to the semiconductor device manufacturing method according to the invention, an advantage is achieved in that an increase in the number of steps is suppressed, a relationship by which the gate threshold voltage of an output stage MOS semiconductor device is higher than the gate threshold voltage of a control MOS semiconductor device is satisfied, and the thickness of a LOCOS oxide film in an device isolation region does not decrease. Also, according to the semiconductor device manufacturing method according to the invention, an advantage is achieved in that the threshold voltage relationship is satisfied by a step of forming a selective oxide film step being carried out after a step of forming a polysilicon film filling a trench, and no foreign object residue remains inside the trench.

BRIEF DESCRIPTION OF THE DRAWINGS

The foregoing advantages and features of the invention will become apparent upon reference to the following detailed description and the accompanying drawings, of which:

FIG. 10-1 is a (first) sectional view showing a manufacturing step flow of the vertical trench gate power IC of FIG. 12.

FIG. 10-2 is a (second) sectional view showing a manufacturing step flow of the vertical trench gate power IC of FIG. 12.

FIG. 11-1 is a (first) sectional view showing a manufacturing step flow of a vertical trench gate power IC of FIG. 13.

FIG. 11-2 is a (second) sectional view showing a manufacturing step flow of the vertical trench gate power IC of FIG. 13.

DETAILED DESCRIPTION OF SPECIFIC EMBODIMENTS

Hereafter, referring to the attached drawings, a detailed description will be given of preferred embodiments of a semiconductor device manufacturing method according to the invention. The invention is not limited to the details of the embodiments described hereafter, provided that it does not exceed the scope thereof. In the specification and attached drawings, a layer or region being prefixed by n or p means that electrons or holes are a majority carrier respectively. Also, + or − superscript added to n or p means that there is a higher impurity concentration or lower impurity concentration respectively than in a layer or region to which + or − superscript is not added. In the following description of the embodiments and in the attached drawings, the same reference signs are given to identical configurations, and a redundant description is omitted.

Embodiment 1

Figure 7:
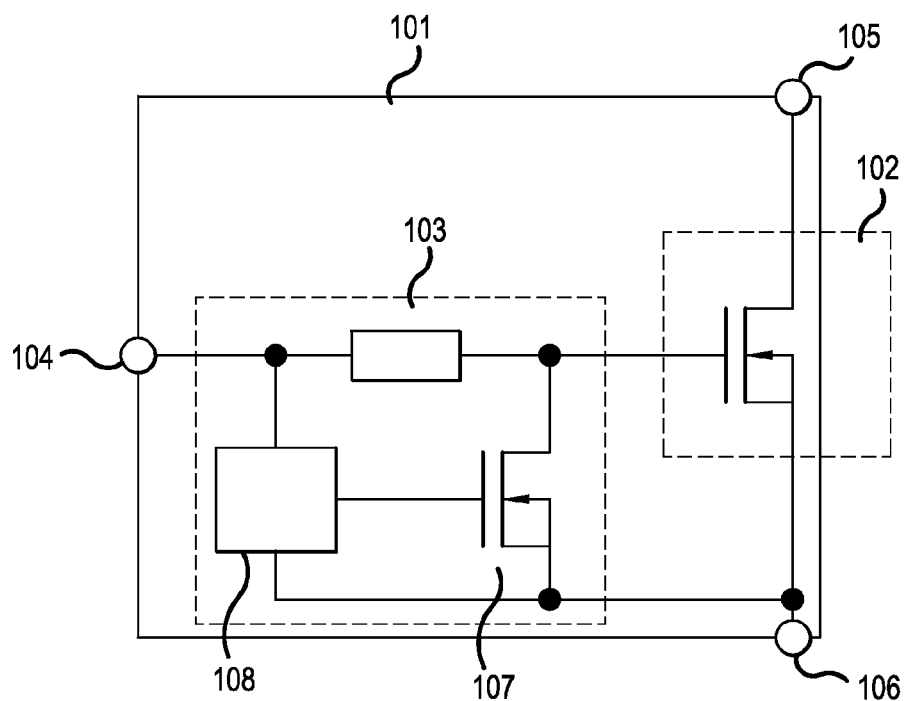
FIG. 7 is a circuit block diagram showing a configuration of a vertical trench gate power IC.
Figure 8:
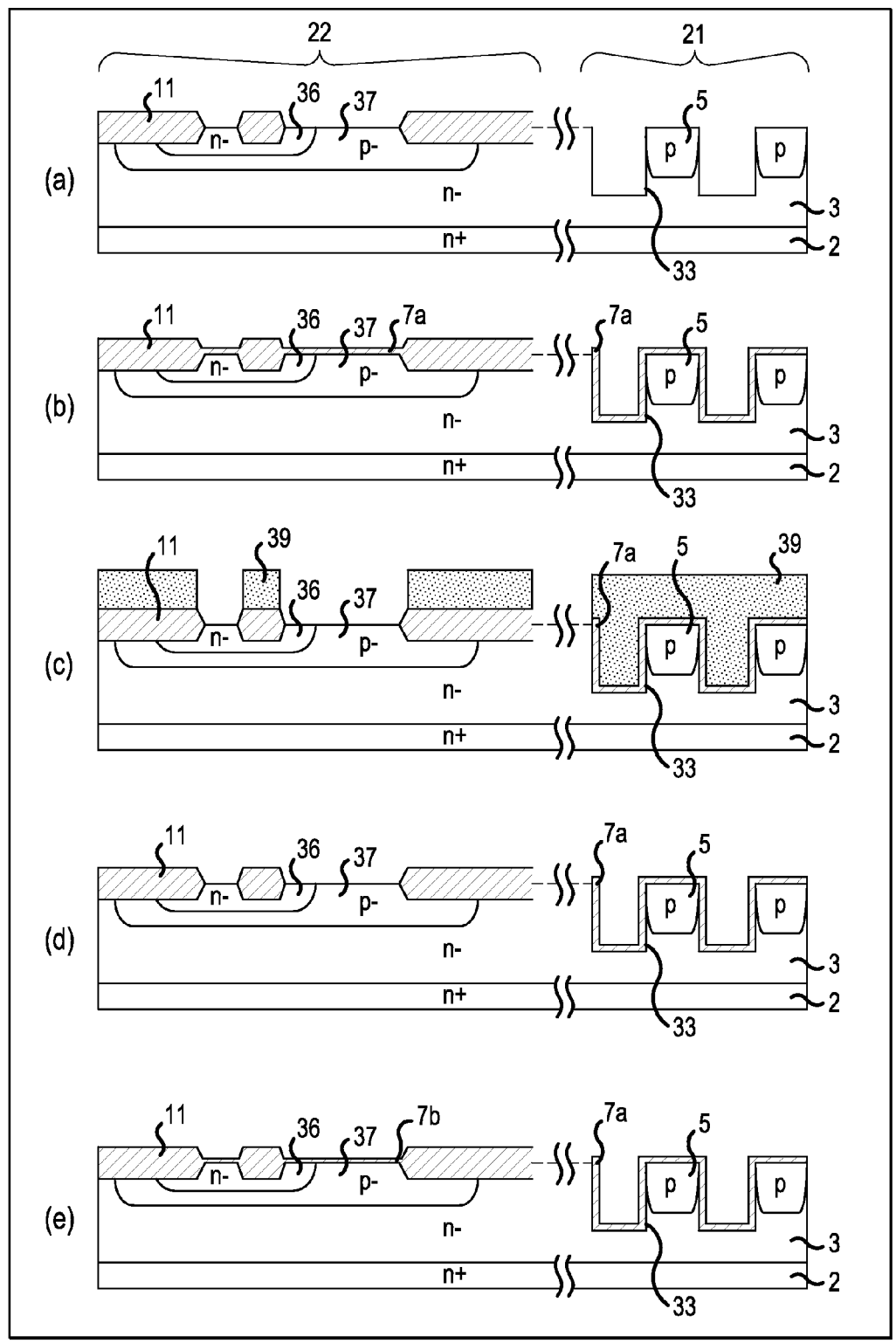
FIG. 8 is a (third) sectional view showing a manufacturing step flow of a vertical trench gate power IC of FIG. 12.
Figure 12:
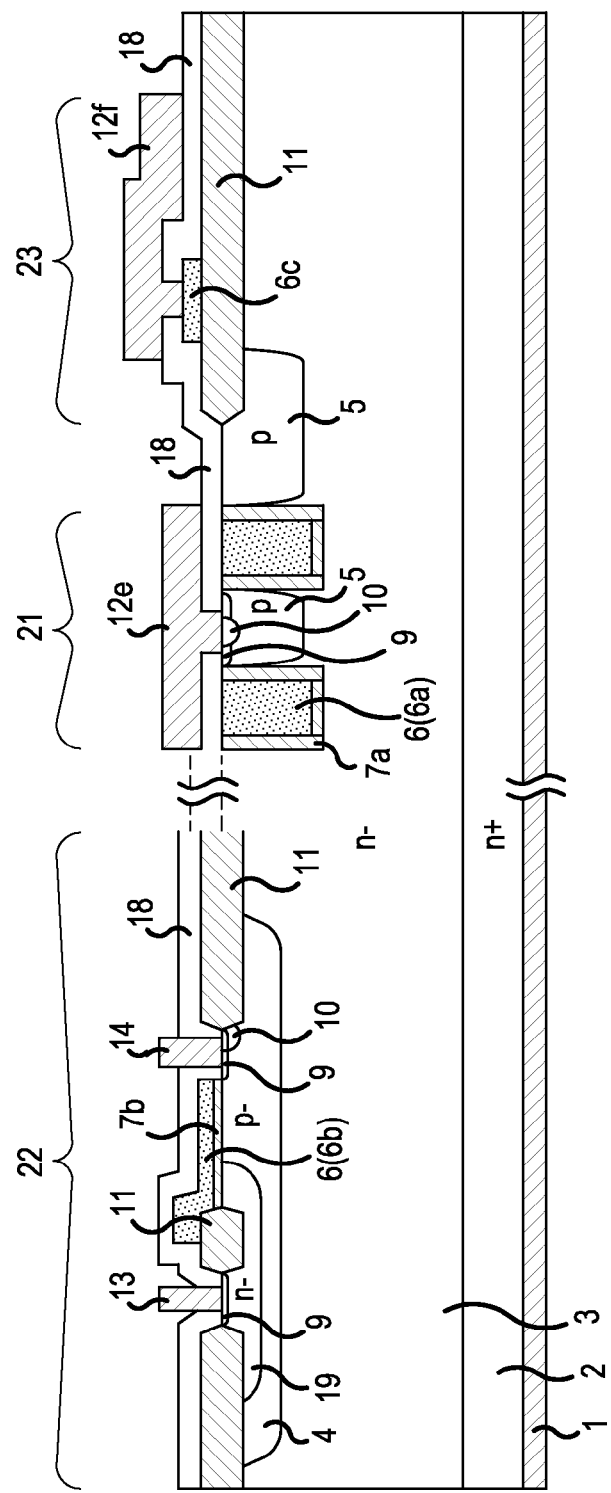
FIG. 12 is a sectional view showing main portions of a vertical trench gate power IC manufactured using the semiconductor device manufacturing method according to Embodiment 1 of the invention.

A description will be given, referring to FIGS. 7 and 12, of a configuration of a vertical trench gate power IC fabricated (manufactured) using the semiconductor device manufacturing method according to Embodiment 1 of the invention. FIG. 12 is a sectional view showing main portions of the vertical trench gate power IC manufactured using the semiconductor device manufacturing method according to Embodiment 1 of the invention. As shown in FIG. 7, vertical trench gate power IC 101 manufactured using the semiconductor device manufacturing method according to Embodiment 1 of the invention is formed of output stage MOSFET (an output stage MOS type semiconductor device) 102 and control circuit unit 103. Control circuit unit 103 includes pull-down MOSFET (a control MOS type semiconductor device) 107 and pull-down MOSFET 107 drive circuit 108.

Pull-down MOSFET 107 controls and protects output stage MOSFET 102. Output stage MOSFET 102 and pull-down MOSFET 107 are provided on the same semiconductor substrate. For example, a silicon substrate formed of $n^+$ semiconductor substrate 2 on which is grown $n^-$ epitaxial semiconductor layer 3 of an impurity concentration lower than that of the $n^+$ semiconductor substrate may be used as the semiconductor substrate. Vertical trench gate MOSFET region (main semiconductor device portion) 21, lateral planar gate MOSFET region (control semiconductor device portion) 22, and junction termination region 23 are formed on this kind of silicon substrate.

A vertical trench gate MOSFET is formed as output stage MOSFET 102 in vertical trench gate MOSFET region 21. Specifically, p-channel diffusion region (second conductivity type semiconductor region) 5 is selectively provided in a surface layer on n⁻ epitaxial semiconductor layer 3 side (hereafter taken to be the front surface) of the silicon substrate. A trench is provided deeper than p-channel diffusion region 5 from the front surface of the silicon substrate, so as to be in contact with the side surface of p-channel diffusion region 5. First gate oxide film 7a is provided along the internal wall of the trench. Polysilicon film 6a is formed on first gate oxide film 7a inside the trench. The polysilicon film 6a forms gate electrode 6 of the vertical trench gate MOSFET.

N⁺ region 9 forming an n⁺ source region (second first conductivity type semiconductor region) is selectively provided inside p-channel diffusion region 5 so as to be in contact with the side wall of the trench. That is, the trench in which gate electrode 6 is provided penetrates p-channel diffusion region 5 and n⁺ region 9, reaching n⁻ epitaxial semiconductor layer 3. Also, p⁺ contact region 10 is selectively provided inside p-channel diffusion region 5 so as to be in contact with n⁺ region 9. Source electrode film 12e is in contact with n⁺ region 9 and p⁺ contact region 10 provided inside p-channel diffusion region 5, forming a source terminal of output stage MOSFET 102. The source electrode film 12e is electrically isolated from gate electrode 6 by interlayer dielectric 18.

A high breakdown voltage lateral planar gate MOSFET is formed as pull-down MOSFET 107 in lateral planar gate MOSFET region 22. Specifically, p⁻ well region 4, n⁻ offset drain region 19, n⁺ region 9 forming an n⁺ drain region, n⁺ region 9 forming an n⁺ source region, and p⁺ contact region 10 are formed in lateral planar gate MOSFET region 22.

Electrode films 13 and 14 forming a drain electrode film and a source electrode film are in contact with n⁺ region 9 forming the n⁺ drain region and n⁺ region 9 forming the n⁺ source region respectively, forming a drain terminal and a source terminal. Specifically, p⁻ well region 4 is provided in the surface layer on n⁻ epitaxial semiconductor layer 3 side (front surface) of the silicon substrate. N⁻ offset drain region 19 is provided inside p⁻ well region 4.

N⁺ region 9 forming the n⁺ drain region is provided inside n⁻ offset drain region 19, in contact with electrode film 13 forming the drain electrode film. N⁺ region 9 forming the n⁺ source region and p⁺ contact region 10 are provided inside p⁻ well region 4, in contact with electrode film 14 forming the source electrode film. N⁺ region 9 forming the n⁺ source region and p⁺ contact region 10 are in contact with each other. Gate electrode 6 formed of polysilicon film 6b on second gate oxide film 7b is provided on the surface of a portion of p⁻ well region 4 sandwiched by n⁺ region 9 forming the n⁺ source region and n⁻ offset drain region 19. The thickness of second gate oxide film 7b may be, for example, less than the thickness of first gate oxide film 7a.

Electrode films 13 and 14 and gate electrode 6 are isolated from each other by interlayer dielectric 18. LOCOS oxide film 11 is formed as a device isolation region between vertical trench gate MOSFET region 21 lateral planar gate MOSFET region 22. LOCOS oxide film 11 is also formed in the device isolation region from another, unshown, lateral MOSFET. Junction termination region 23 includes a field plate structure formed of metal wire 12f and polysilicon wire 6c on device isolation region LOCOS oxide film 11.

Junction termination region 23 encloses vertical trench gate MOSFET region 21 and lateral planar gate MOSFET region 22. A field plate (metal wire 12f and polysilicon wire 6c) is provided on LOCOS oxide film 11 formed on the front surface of the silicon substrate in junction termination region 23. Drain electrode film 1 is provided across vertical trench gate MOSFET region 21, lateral planar gate MOSFET region 22, and junction termination region 23, forming a drain terminal of output stage MOSFET 102, on the surface (the rear surface of the silicon substrate) of n⁺ semiconductor substrate 2, which forms a drain region (first first conductivity semiconductor region) of the vertical trench gate MOSFET.

Next, a detailed description will be given of the semiconductor device manufacturing method according to Embodiment 1 of the invention. FIGS. 8, 10-1, and 10-2 are sectional views showing a manufacturing step flow of the vertical trench gate power IC of FIG. 12. Firstly, n⁻ diffusion region 36, p⁻ diffusion region 37, and the like, necessary in the formation of a lateral planar gate MOSFET are formed in a surface layer on n⁻ epitaxial semiconductor layer 3 side (front surface side) of the silicon substrate in lateral planar gate MOSFET region 22 (FIG. 10-1(a)). N⁻ diffusion region 36 is a region that becomes n⁻ offset region drain region 19. P⁻ diffusion region 37 is a region that becomes p⁻ well region 4.

Figures 1, 10:
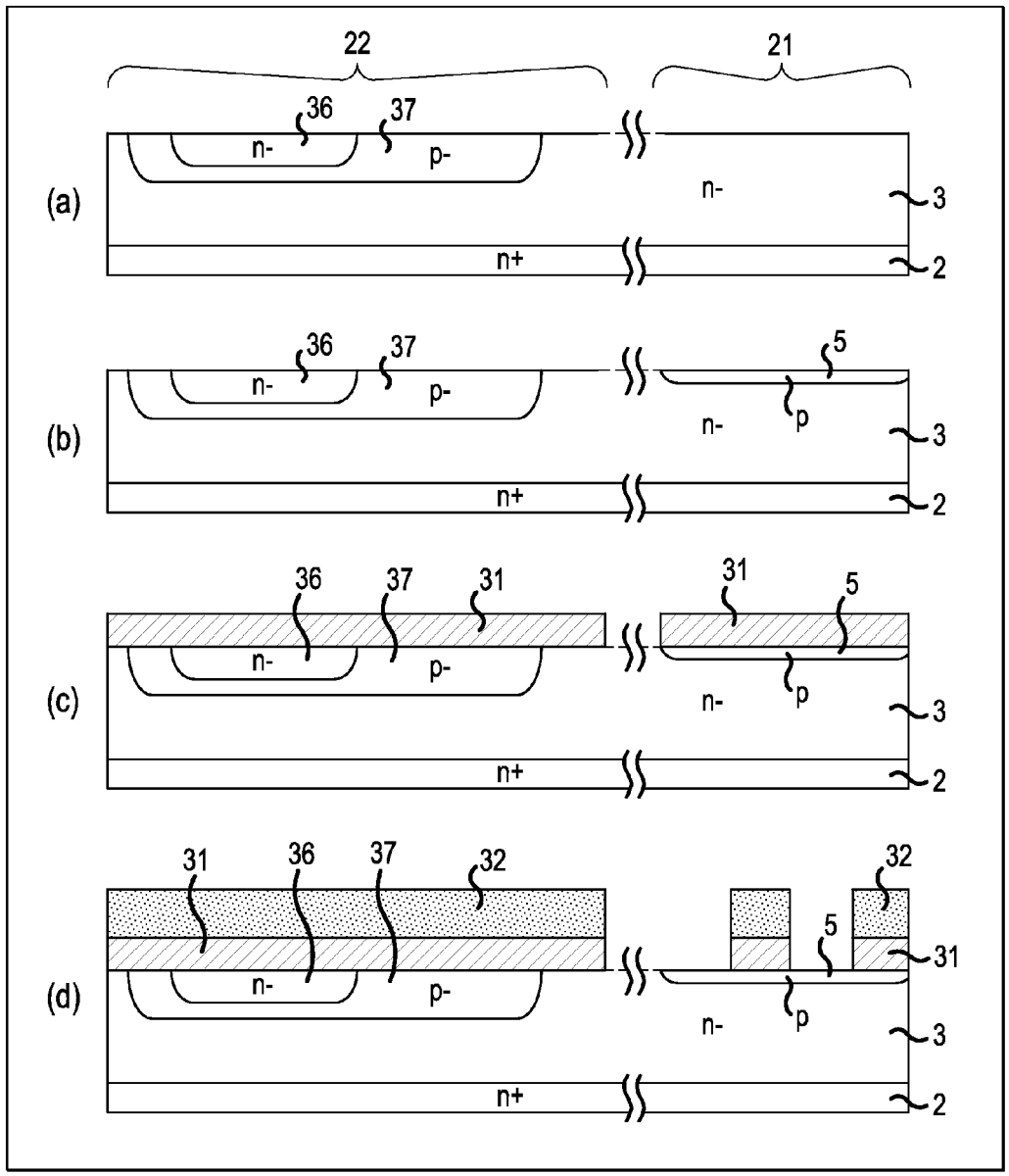
Figures 2, 10:
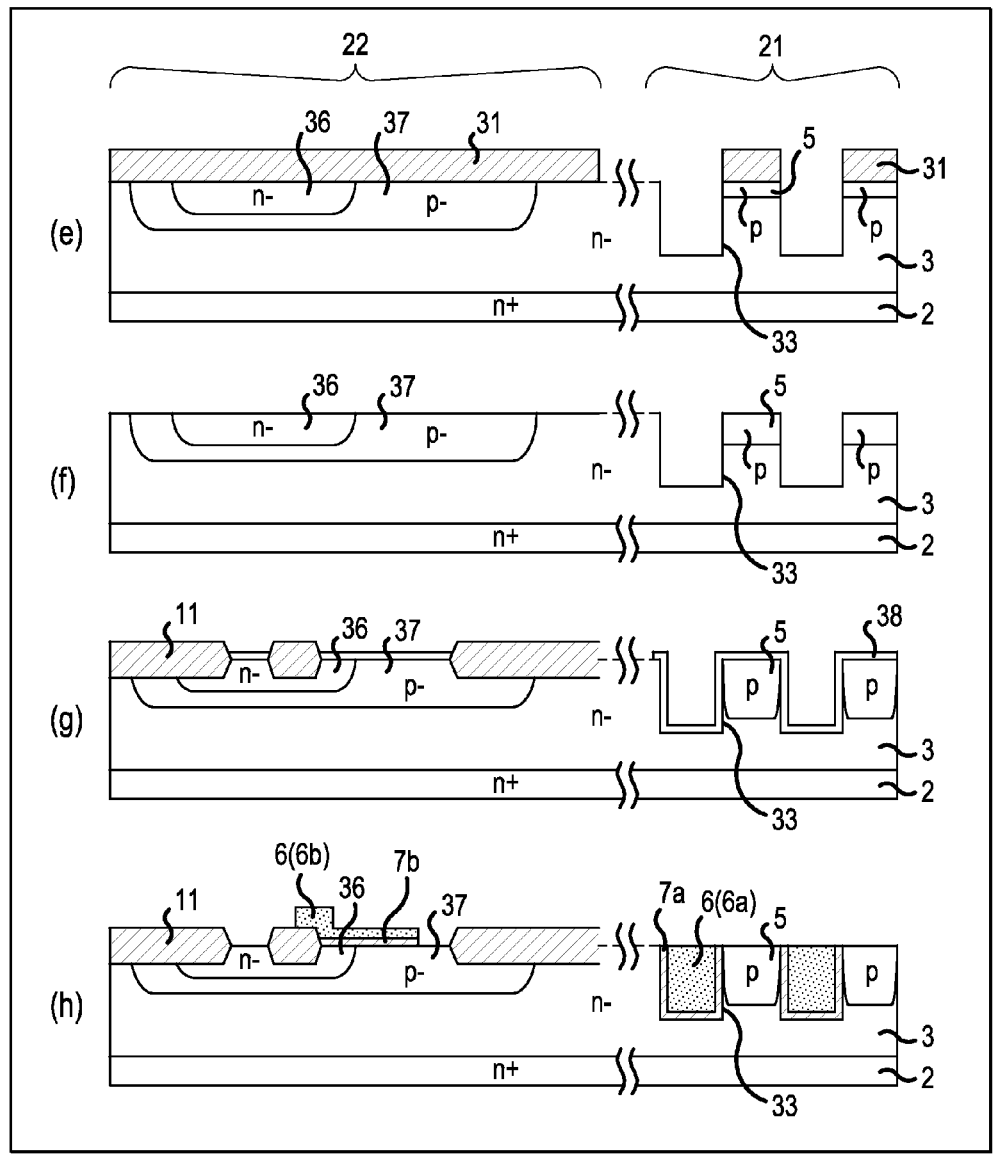

Next, an implantation of ions into vertical trench gate MOSFET region 21 is carried out in order to form p-channel diffusion region 5 (FIG. 10-1(b)). Commonly, for this ion implantation, a dose of, for example, $0.5 \times 10^{13}$ cm⁻² to $3 \times 10^{13}$ cm⁻² of boron is implanted. Next, mask oxide film 31, which forms a trench formation mask, is formed using a thermal oxidation method (FIG. 10-1(c)). Commonly, a thermally-oxidized film of a thickness of in the region of 0.4 μm to 0.6 μm is formed using a pyrogenic oxidation method at a temperature of, for example, 1,000 to 1,100° C. When forming mask oxide film 31, the impurity introduced into the silicon substrate by the ion implantation for forming p-channel diffusion region 5 is thermally diffused.

Next, resist 32, in which places in which the trench is to be formed are opened, is formed on the surface of mask oxide film 31. Next, etching is carried out with resist 32 as a mask, selectively removing mask oxide film 31 in the places in which the trench is to be formed (FIG. 10-1(d)). Next, after removing resist 32, the silicon substrate is etched with mask oxide film 31 as a mask, forming trench 33 in n⁻ epitaxial semiconductor layer 3 to a depth not reaching n⁺ semiconductor substrate 2 (FIG. 10-2(e)). Next, mask oxide film 31 is removed by etching, exposing the front surface of the silicon substrate (the surface of n⁻ epitaxial semiconductor layer 3) (FIG. 10-2(f)).

Next, a buffer oxide film and silicon nitride film are formed sequentially on the exposed surface of the silicon substrate (including also the internal wall of trench 33). Specifically, LOCOS oxide film 11 formation method is such that the buffer oxide film is formed to a thickness of 250 to 350 Å using a thermal processing at a low temperature of in the region of 800 to 900° C., and the silicon nitride film is formed to a thickness of 1,000 to 3,000 Å on the buffer oxide film using a CVD (Chemical Vapor Deposition) method. Next, the buffer oxide film and silicon nitride film are removed in a photolithography step in places in which LOCOS oxide film 11 is to be formed in the device isolation region, forming mask 38 in which regions in which LOCOS oxide film 11 is to be formed are opened.

Next, thermal oxidation is carried out, forming LOCOS oxide film 11 on the silicon substrate surface exposed in the aperture portions (the portions from which the buffer oxide film and silicon nitride film have been removed) of mask 38 (FIG. 10-2(g)). Subsequently, LOCOS oxide film 11 is formed by the whole of mask 38 (the buffer oxide film and silicon nitride film) being removed (FIG. 8(a)). A reduction in the thickness of LOCOS oxide film 11 caused by the removal of the silicon nitride film and buffer oxide film is small enough not to cause any decrease in the device isolating function of LOCOS oxide film 11.

Commonly, the formation using a thermal oxidation method of the oxide film including LOCOS oxide film 11 is such that an oxide film of a thickness of in the region of 0.6 μm to 0.8 μm is formed using pyrogenic oxidation at a temperature of, for example, 1,000 to 1,100° C. When forming the oxide film, the impurity introduced into the silicon substrate by the ion implantation for forming p-channel diffusion region 5 is further thermally diffused, and p-channel diffusion region 5 is formed in vertical trench gate MOSFET region 21. Next, first and second gate oxide films 7a and 7b of differing thicknesses, for the trench gate and lateral planar gate, are formed.

Specifically, first gate oxide film 7a is formed over the whole of the front surface of the silicon substrate, whereby n⁻ epitaxial semiconductor layer 3 (including also the internal wall of trench 33) exposed in LOCOS oxide film 11 is covered with first gate oxide film 7a (FIG. 8(b)). Next, resist 39 is formed, having aperture portions in which regions in which second gate oxide film 7b is to be formed are exposed (FIG. 8(c)). Next, etching is carried out with resist 39 as a mask, removing first gate oxide film 7a above the regions in which second gate oxide film 7b is to be formed (FIG. 8(d)). Next, after removing resist 39, second gate oxide film 7b, of a thickness less than that of first gate oxide film 7a, is formed over the whole of the front surface of the silicon substrate (including also the internal wall of trench 33) (FIG. 8(e)).

Next, a polysilicon film is formed over the whole of the front surface of the silicon substrate so as to be embedded inside trench 33. Next, the formation of polysilicon film 6b, an etch back of the polysilicon film in portions other than polysilicon film 6b, and a heat treatment step are carried out, forming pull-down MOSFET gate electrode 6 formed of polysilicon film 6b and output stage MOSFET gate electrode 6 formed of polysilicon film 6a. At this time, the formation of polysilicon film 6b and the etch back of the polysilicon film may be carried out in the same step (FIG. 10-2(h)). Subsequently, the vertical trench gate power IC shown in FIG. 12 is completed by forming n⁺ region 9 forming the n⁺ source region, p⁺ contact region 10, interlayer dielectric film 18, a contact hole, and metal wire 12f.

As heretofore described, according to Embodiment 1, it is possible to prevent the thickness of the LOCOS oxide film from decreasing due to the mask oxide film etching step when forming the trench, even when carrying out the LOCOS oxide film formation step after the trench formation step. Consequently, it is possible to avoid problems such as a drop in the gate threshold voltage of an inter-device parasitic field MOSFET or a drop in the device breakdown voltage, which occur because of a reduction in the thickness of the LOCOS oxide film.

Also, according to Embodiment 1, the ion implantation step for forming the p-channel diffusion region of the vertical trench gate MOSFET is carried out before the trench formation step, because of which it is possible to activate the impurity introduced into the silicon substrate by the ion implantation for forming the p-channel diffusion region using the heat treatment in the subsequent protective oxide film formation step and device isolation region oxide film formation step. Because of this, it is possible to omit a p-channel diffusion region activating heat treatment step. As heat treatment for in the region of 100 minutes to 300 minutes at a temperature of 1,100 to 1,150° C. is commonly necessary as a channel diffusion region activating heat treatment, a reduction in cost is achieved by the step contraction.

With the semiconductor device manufacturing method according to Embodiment 1, mask oxide film 31 is formed by thermal oxidation, but mask oxide film 31 may also be formed by depositing an oxide film using a CVD method. In this case, the heat treatment when forming the oxide film that is to become the device isolation region is the only p-channel diffusion region formation condition. An advantage in this case is that channel length is suppressed by reducing the number of heat treatments, and it is thus possible to suppress the resistance of the vertical trench gate MOSFET.

Embodiment 2

Figure 13:
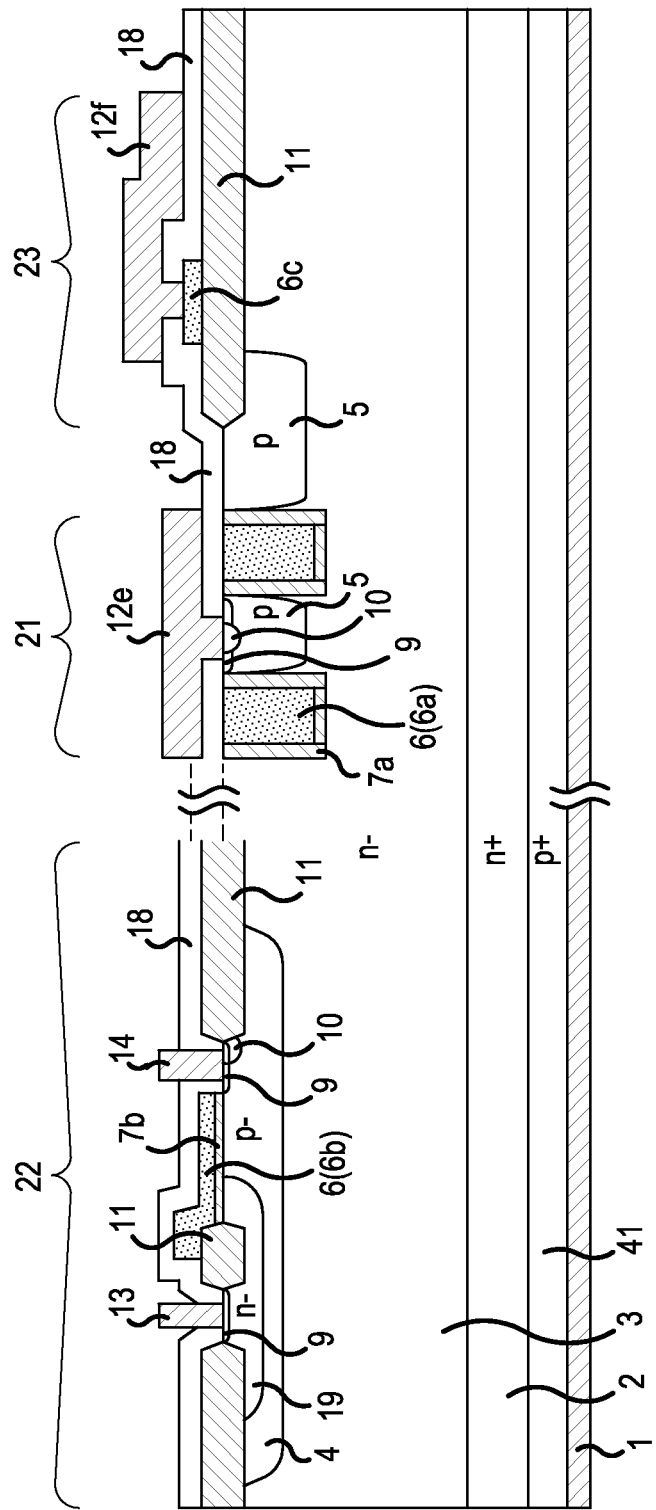
FIG. 13 is a sectional view showing main portions of a vertical trench gate power IC manufactured using the semiconductor device manufacturing method according to Embodiment 2 of the invention.

FIG. 13 is a sectional view showing main portions of a vertical trench gate power IC manufactured using the semiconductor device manufacturing method according to Embodiment 2 of the invention. Points wherein the semiconductor device according to Embodiment 2 differs from the semiconductor device according to Embodiment 1 are that p⁺ semiconductor layer 41 forming a p⁺ collector region is added between n⁺ semiconductor substrate 2 and drain electrode film 1, and that the output stage MOS semiconductor device of vertical trench gate MOSFET region 21 is a vertical trench gate IGBT (insulated gate bipolar transistor). That is, in FIG. 13, reference signs 9, 12e, and 1 represent an n⁺ emitter region, an emitter electrode, and a collector electrode respectively.

Figure 1:
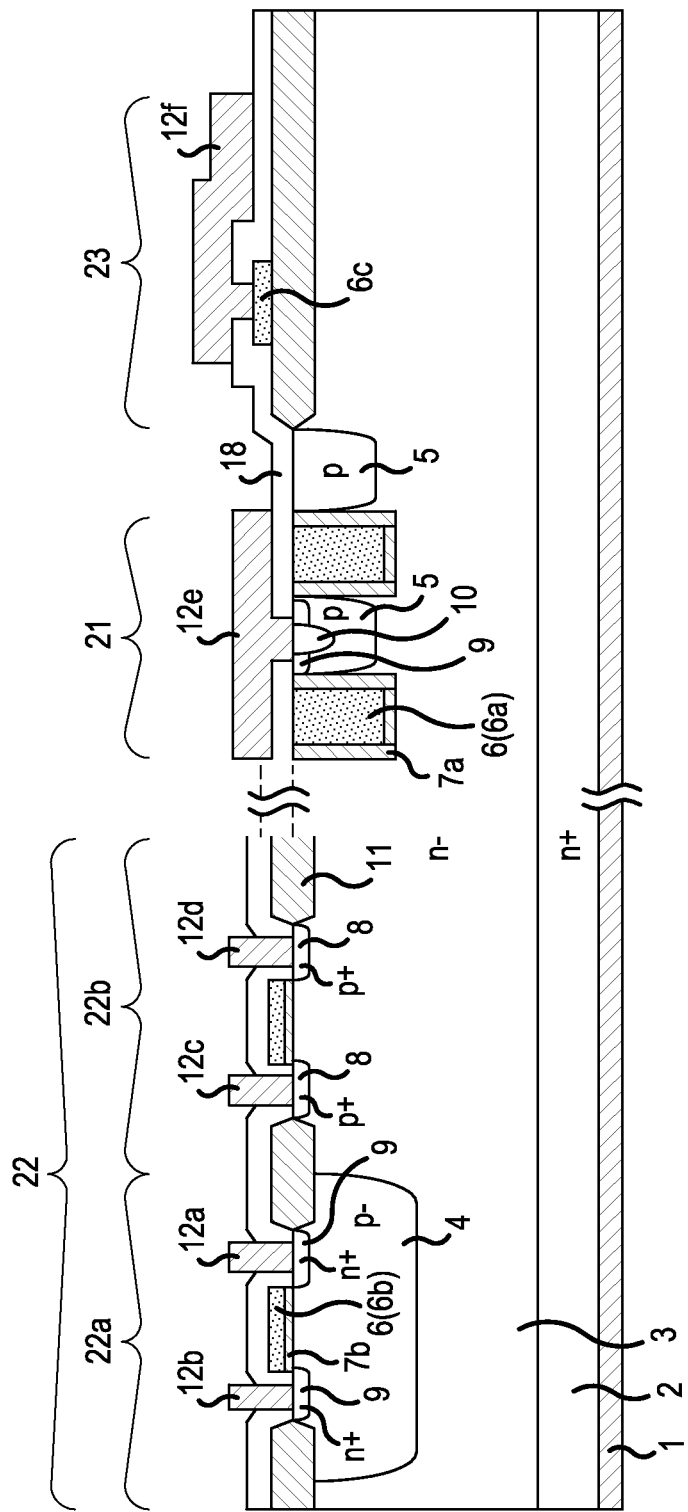
FIG. 1 is a sectional view showing main portions of a vertical trench gate power IC manufactured using the semiconductor device manufacturing method according to Embodiment 3 of the invention.
Figures 1, 11:
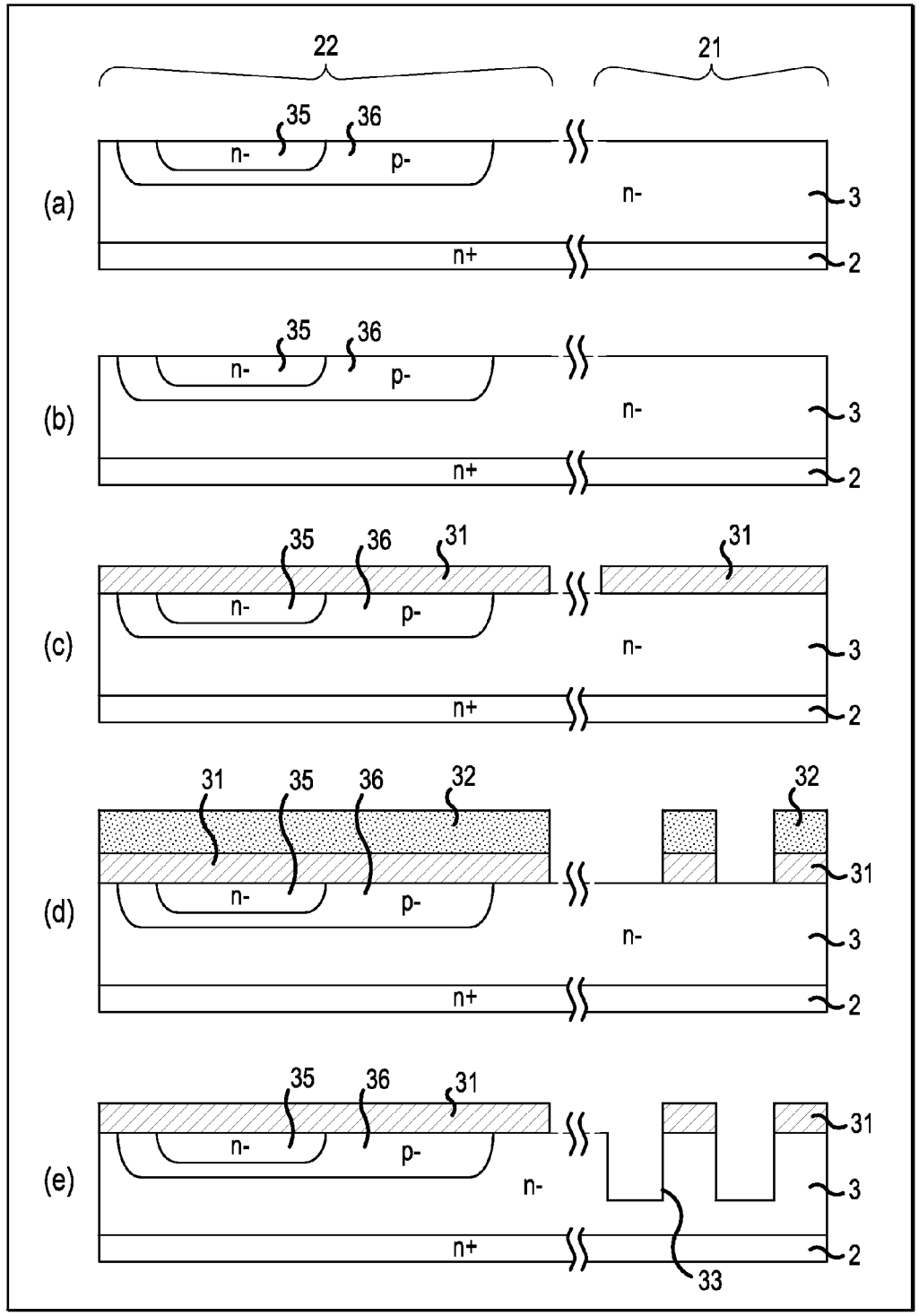
Figures 2, 11:
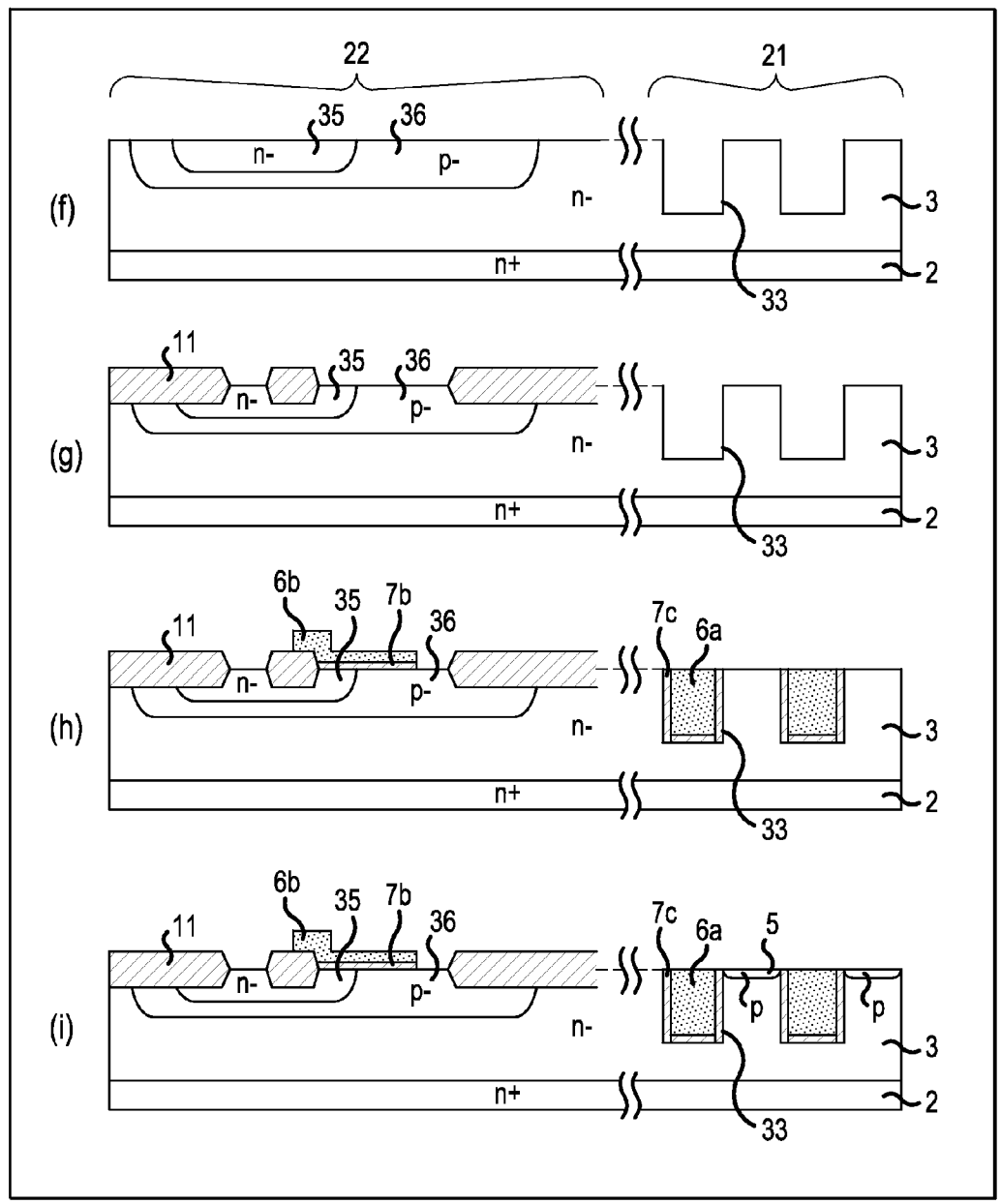

Next, a detailed description will be given of the semiconductor device manufacturing method according to Embodiment 2 of the invention. FIGS. 11-1 and 11-2 are sectional views showing a manufacturing step flow of the vertical trench gate power IC of FIG. 13. FIGS. 11-1 and 11-2 show a manufacturing step flow after n⁺ epitaxial semiconductor layer 2 and n⁻ epitaxial semiconductor layer 3 are deposited sequentially on a p⁺ semiconductor substrate (not shown) that is to become p⁺ semiconductor layer 41. In Embodiment 1, the ion implantation step for forming p-channel diffusion region 5 of the vertical trench gate MOSFET is carried out before trench 33 formation step, but in Embodiment 2, the ion implantation step may be carried out after trench 33 formation step, as shown in FIG. 11-2(i).

Figure 2:
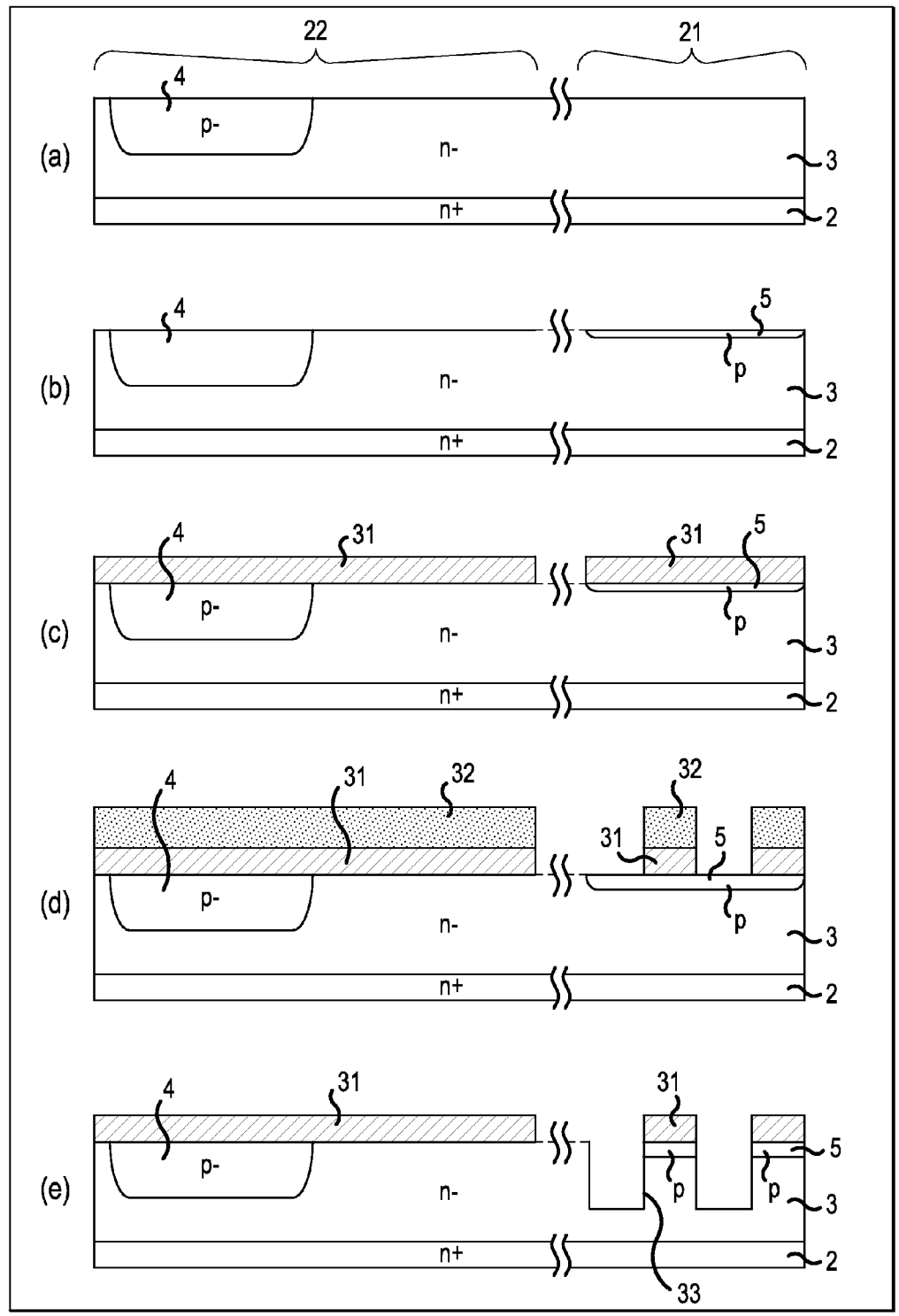
FIG. 2 is a (first) sectional view showing a manufacturing step flow of the vertical trench gate power IC of FIG. 1.
Figure 3:
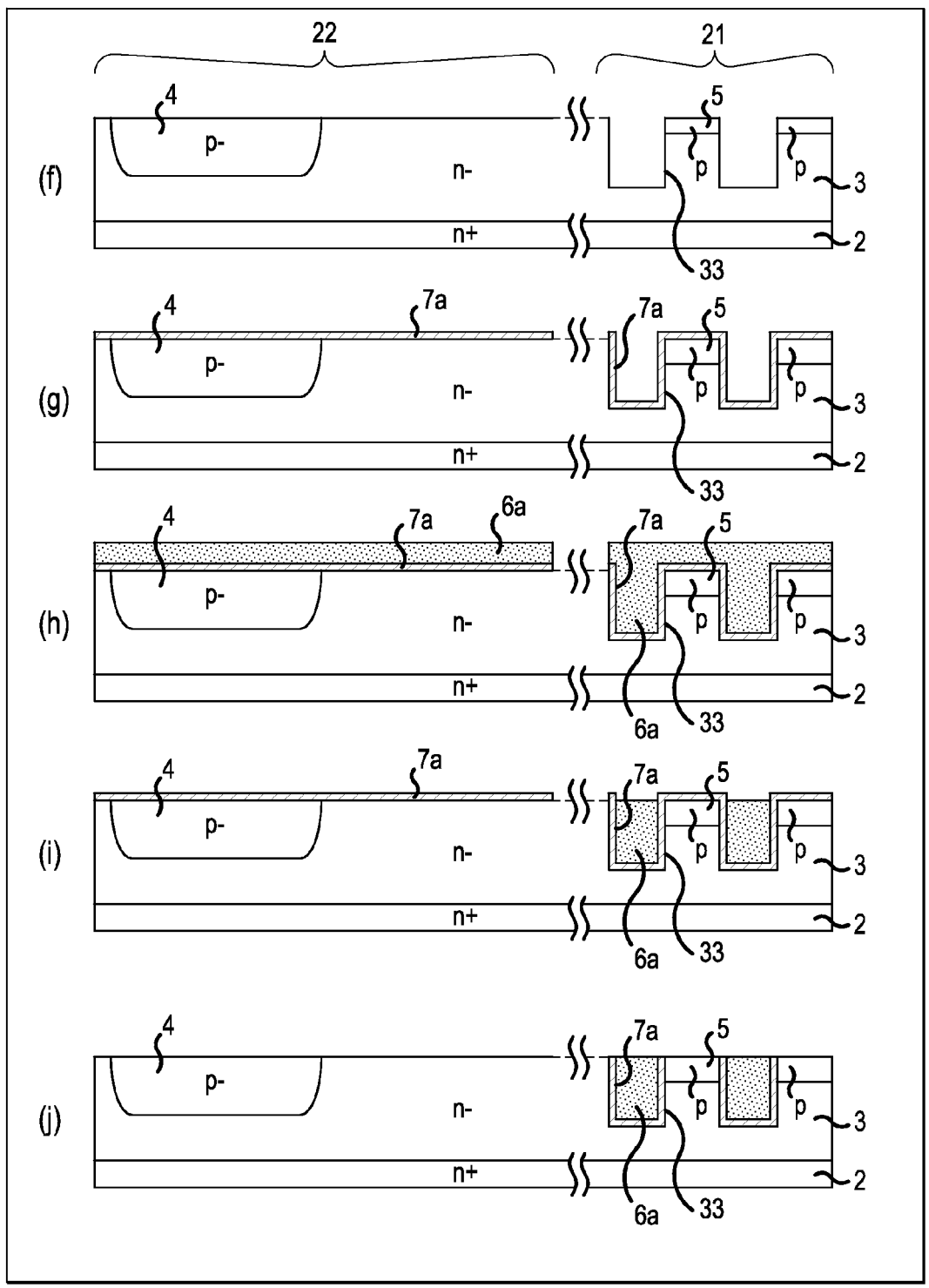
FIG. 3 is a (second) sectional view showing a manufacturing step flow of the vertical trench gate power IC of FIG. 1.
Figure 4:
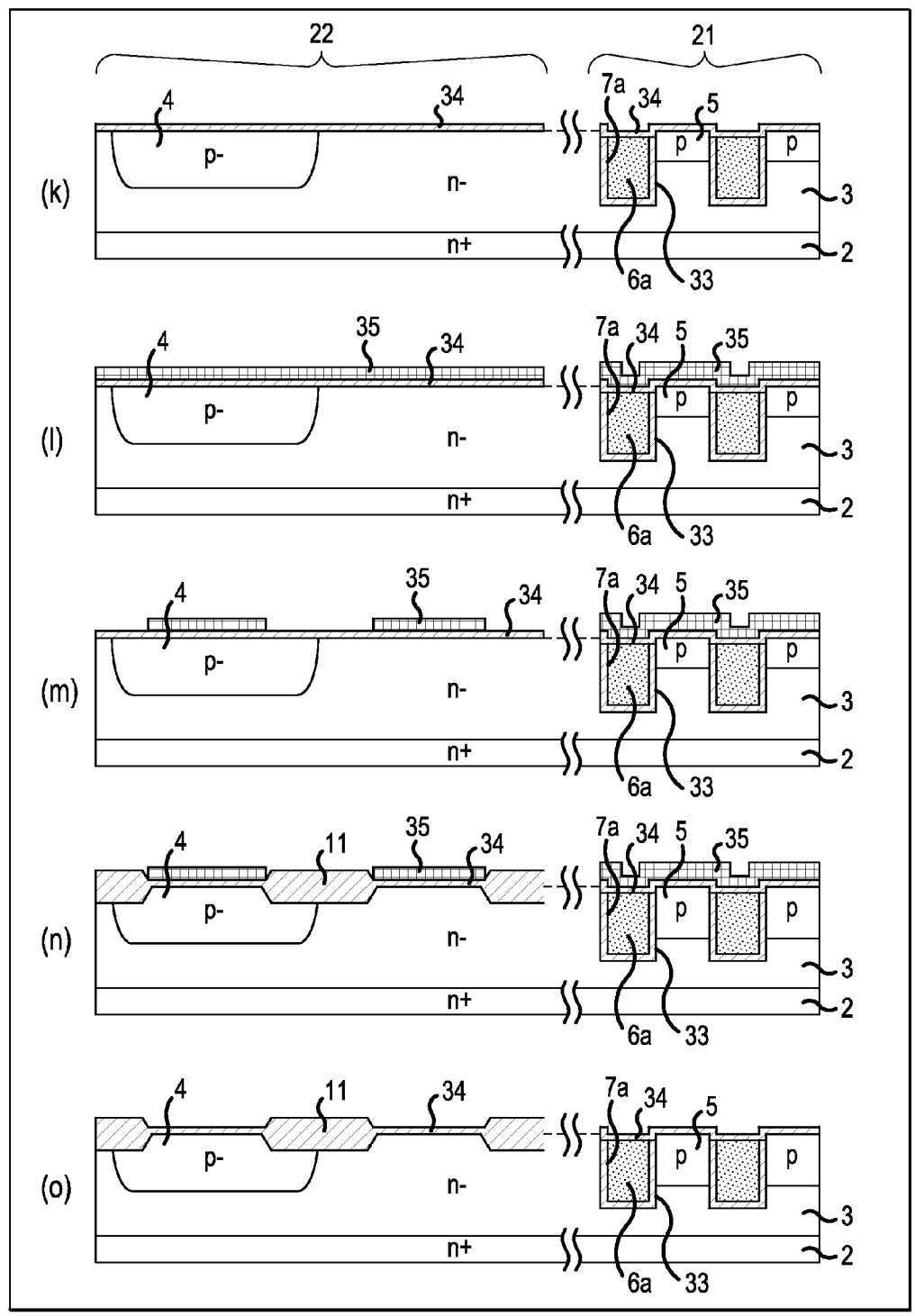
FIG. 4 is a (third) sectional view showing a manufacturing step flow of the vertical trench gate power IC of FIG. 1.
Figure 5:
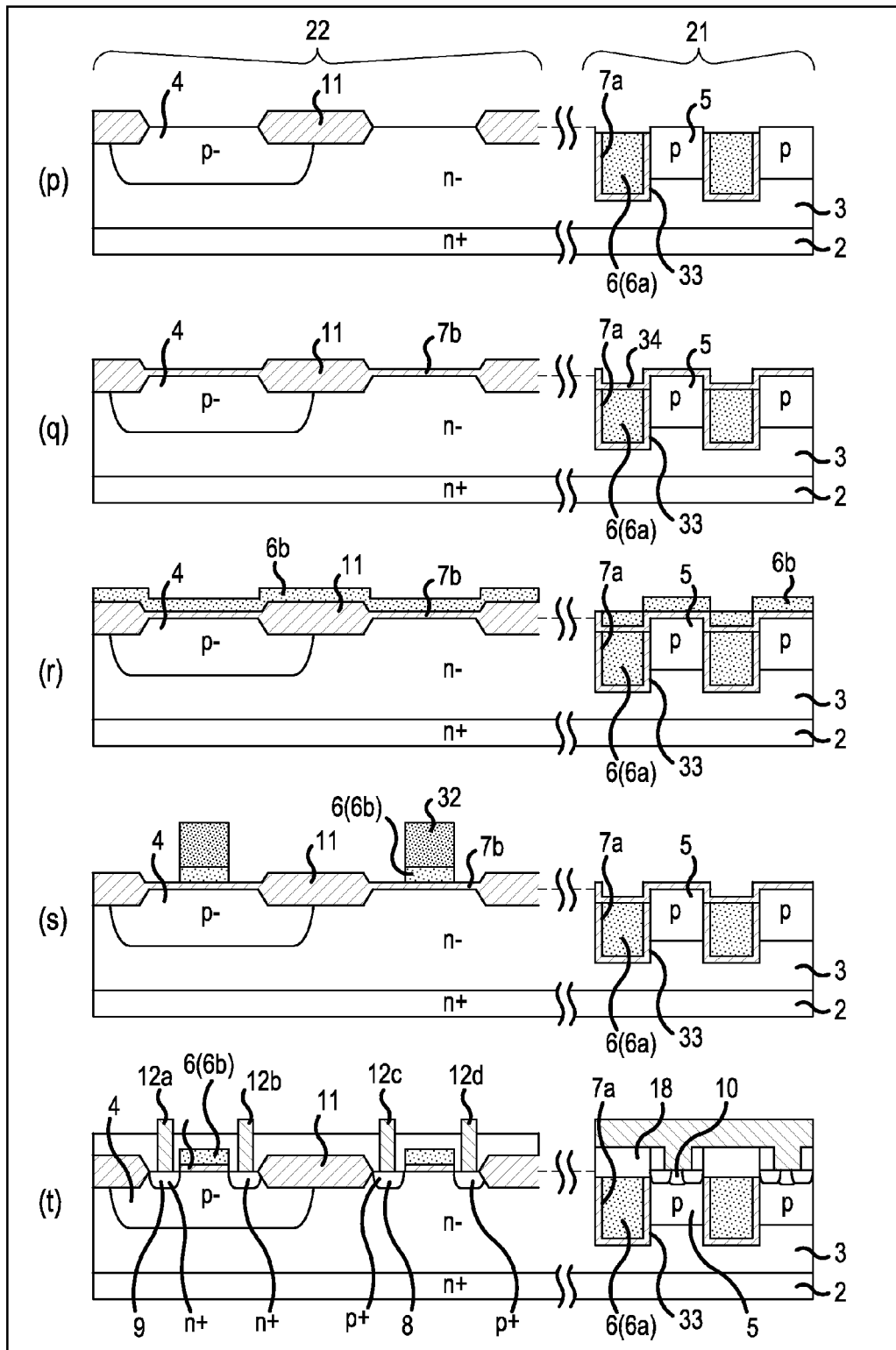
FIG. 5 is a (fourth) sectional view showing a manufacturing step flow of the vertical trench gate power IC of FIG. 1.
Figure 6:
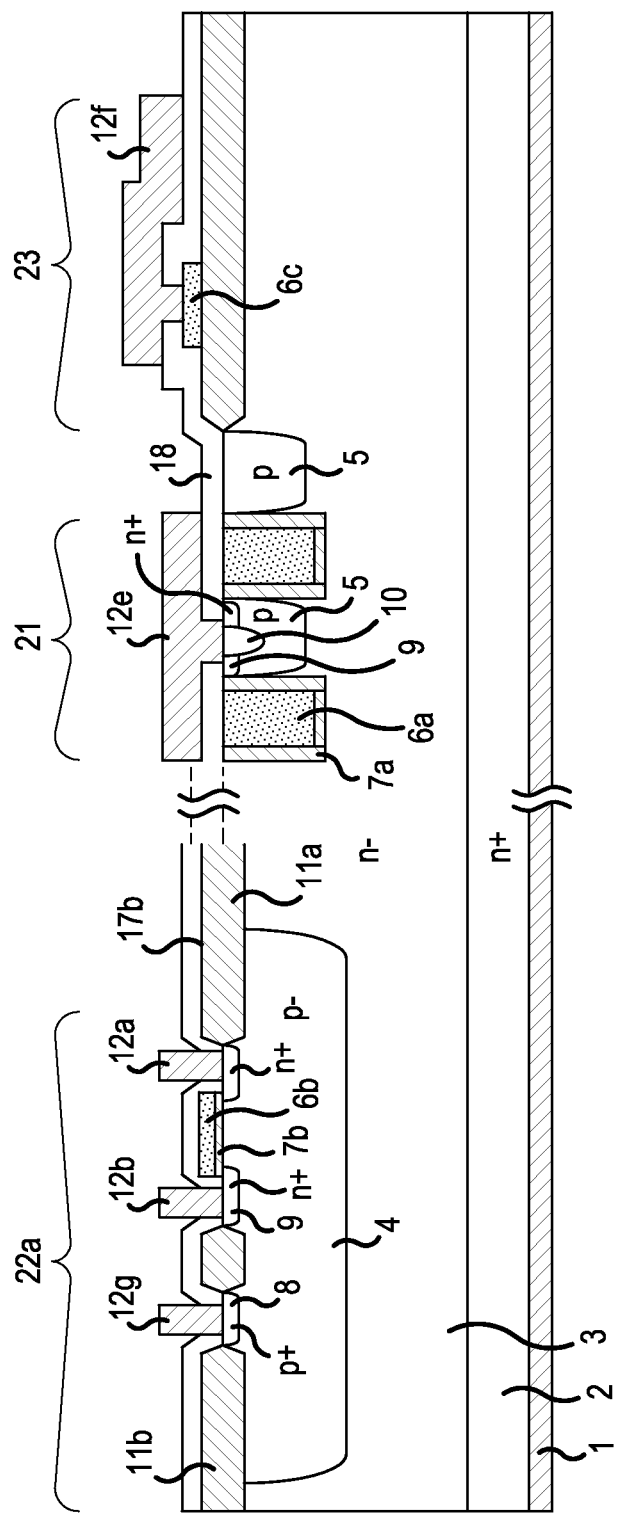
FIG. 6 is a sectional view showing a configuration of a heretofore known vertical trench gate power IC.

FIGS. 11-1 and 11-2 show a case in which the ion implantation step for forming p-channel diffusion region 5 is carried out after second gate oxide film 7b formation step. Activation of p-channel diffusion region 5 is carried out by adding an appropriate heat treatment after the ion implantation step for forming p-channel diffusion region 5 is carried out. Commonly, a heat treatment for in the region of 100 minutes to 300 minutes at a temperature of 1,100 to 1,150° C. in an inert gas atmosphere is carried out as p-channel diffusion region 5 activating heat treatment.

As heretofore described, according to Embodiment 2, it is possible to obtain the same advantages as in Embodiment 1.

In Embodiments 1 and 2, a description has been given using as an example a case wherein a lateral planar gate MOSFET is formed as the control MOSFET, but a lateral trench gate MOSFET may be used instead of a lateral planar gate MOSFET. Also, in Embodiment 2, a description has been given using as an example a case wherein a vertical trench gate IGBT is formed as the output stage MOSFET, but a lateral trench gate IGBT may be used instead of a vertical trench gate IGBT.

Embodiment 3

A point wherein the vertical trench gate power IC manufacturing method according to Embodiment 3 differs from the vertical trench gate power IC manufacturing method according to Embodiment 1 is that the output stage MOSFET gate structure is formed before LOCOS oxide film 11 is formed. In Embodiment 3, a description will be given using as an example a vertical trench gate power IC with a configuration wherein the output stage MOSFET semiconductor device is a vertical trench gate MOSFET, and the control MOS semiconductor device is a CMOS. FIG. 1 is a sectional view showing main portions of the vertical trench gate power IC manufactured using the semiconductor device manufacturing method according to Embodiment 3 of the invention. The configurations of vertical trench gate MOSFET region 21 and junction termination region 23 are the same as in Embodiment 1.

A CMOS formed of a lateral n-channel MOSFET and lateral p-channel MOSFET is formed as pull-down MOSFET 107 in lateral planar gate MOSFET region 22. A lateral n-channel MOSFET with a planar gate structure is formed in lateral planar gate n-channel MOSFET region 22a in lateral planar gate MOSFET region 22. Specifically, p⁻ well region 4 is selectively provided in a surface layer on n⁻ epitaxial semiconductor layer 3 side (front surface) of the silicon substrate in lateral planar gate n-channel MOSFET region 22a.

N⁺ region 9 forming an n⁺ source region and n⁺ region 9 forming an n⁺ drain region are each selectively provided inside p⁻ well region 4. Polysilicon film 6b is selectively formed on second gate oxide film 7b on a portion of the surface of p⁻ well region 4 sandwiched by n⁺ regions 9. The thickness of second gate oxide film 7b may be, for example, less than the thickness of first gate oxide film 7a. Polysilicon film 6b forms gate electrode 6 of the lateral n-channel MOSFET. Electrode films 12a and 12b, which form a source electrode film and a drain electrode film, are in contact with n⁺ region 9 forming the n⁺ source region and n⁺ region 9 forming the n⁺ drain region respectively. Electrode films 12a and 12b and gate electrode 6 are electrically isolated from each other by interlayer insulating film 18.

A lateral p-channel MOSFET with a planar gate structure is formed in lateral planar gate p-channel MOSFET region 22b. Specifically, p⁺ region 8 forming a p⁺ source region and p⁺ region 8 forming a p⁺ drain region are each selectively provided in a surface layer of the front surface of the silicon substrate in lateral planar gate p-channel MOSFET region 22b. Polysilicon film 6b is formed on second gate oxide film 7b on a portion of the surface of n⁻ epitaxial semiconductor layer 3 sandwiched by p⁺ regions 8. Polysilicon film 6b forms gate electrode 6 of the lateral p-channel MOSFET.

Electrode films 12c and 12d, which form a source electrode film and a drain electrode film, are in contact with p⁺ region 8 forming the p⁺ source region and p⁺ region 8 forming the p⁺ drain region respectively. Electrode films 12c and 12d and gate electrode 6 are electrically isolated from each other by interlayer dielectric 18. The devices formed in vertical trench gate MOSFET region 21, the devices formed in lateral planar gate n-channel MOSFET region 22a, and the devices formed in lateral planar gate p-channel MOSFET region 22b are isolated by LOCOS oxide film 11 formed on the front surface of the silicon substrate.

Next, a detailed description will be given of the semiconductor device manufacturing method according to Embodiment 3 of the invention. FIG. 2 to FIG. 5 are sectional views showing a manufacturing step flow of the vertical trench gate power IC of FIG. 1. Specifically, a description will be given using as an example a case of fabricating a semiconductor device (the vertical trench gate power IC) including on the same semiconductor substrate a vertical trench gate MOSFET as an output stage MOS semiconductor device and a lateral planar gate MOSFET as a control MOS semiconductor device. In FIGS. 2 to 5, a depiction and description of the formation of the junction termination region 23 are omitted.

Firstly, n⁻ epitaxial semiconductor layer 3 is grown on n⁺ semiconductor substrate 2, forming a semiconductor substrate (a silicon substrate). Next, p⁻ well region 4 is selectively formed in a surface layer of n⁻ epitaxial semiconductor layer 3 (a surface layer on the front surface side of the silicon substrate) in lateral planar gate MOSFET region 22 by various kinds of ion implantation step and diffusion step which are not shown (FIG. 2(a)). Next, an implantation of, for example, boron (B) ions is carried out into vertical trench gate MOSFET region 21, selectively forming p-channel diffusion region 5 in a surface layer of n⁻ epitaxial semiconductor layer 3 (a surface layer on the front surface side of the silicon substrate) (FIG. 2(b)).

Mask oxide film 31, which forms an etching mask when forming trench 33, is formed over the whole of the front surface of the silicon substrate (FIG. 2(c). Resist 32, in which regions in which trench 33 is to be formed are opened, is formed on the surface of mask oxide film 31 in a photolithography step and an etching step. Next, etching is carried out with resist 32 as a mask, selectively removing mask oxide film 31 in the places in which trench 33 is to be formed (FIG. 2(d)).

Next, after removing resist 32, the silicon substrate is etched with mask oxide film 31 as a mask, forming trench 33 in n⁻ epitaxial semiconductor layer 3 to a depth not reaching n⁺ semiconductor substrate 2 (FIG. 2(e)). Next, mask oxide film 31 is removed (FIG. 3(f)). Next, first gate oxide film 7a of the vertical trench gate MOSFET is formed over the whole of the front surface (including the internal wall of trench 33) of the silicon substrate (FIG. 3(g)). Next, polysilicon film 6a, which forms a gate electrode of the vertical trench gate MOSFET, is formed over the whole of the front surface of the silicon substrate (FIG. 3(h)).

In this way, first gate oxide film 7a and polysilicon film 6a are formed sequentially over the whole of the front surface of the silicon substrate after trench 33 is formed, thereby filling narrow, deep trench 33 with polysilicon film 6a on first gate oxide film 7a. As no photolithography step is provided between trench 33 being formed and trench 33 being filled with polysilicon film 6a, resist 32 does not enter trench 33. Next, in a photolithography step and etching step, polysilicon film 6a on the front surface of the silicon substrate is etched back and removed, leaving polysilicon 6a film filling the trench 33 (FIG. 3(i)).

Next, first gate oxide film 7a other than first gate oxide film 7a formed on the internal wall of trench 33 is removed (FIG. 3(j)). Next, buffer oxide film 34 is formed on the surface of the silicon substrate and the surface of polysilicon film 6a (FIG. 4(k)). Next, silicon nitride film 35 is formed over the whole of the surface of buffer oxide film 34 (FIG. 4(l)). Next, predetermined regions of silicon nitride film 35 are removed in a photolithography step and etching step (FIG. 4(m)). Next, LOCOS oxide film 11 is selectively formed in the removed regions of silicon nitride film 35 (FIG. 4(n)). Carrying out the step of forming LOCOS oxide film 11 after the step of filling trench 33 with polysilicon film 6a in this way is one of the characteristics of the invention.

Next, silicon nitride film 35 is removed (FIG. 4(o)). Buffer oxide film 34 is removed (FIG. 5(p)). Second gate oxide film 7b of the lateral planar gate MOSFET is formed over the whole of the front surface of the silicon substrate (FIG. 5(q)). As the manufacturing method according to the invention is such that first and second gate oxide films 7a and 7b are formed independently on each device in this way, it is possible to independently form first and second gate oxide films 7a and 7b to a desired thickness on each device. Next, polysilicon film 6b of the lateral planar gate MOSFET is formed over the whole of the front surface of the silicon substrate (FIG. 5(r)).

Next, with resist 32 as a mask, gate electrodes 6 formed of polysilicon film 6b of the lateral n-channel MOSFET and lateral p-channel MOSFET are formed in a photolithography step and an etching step (FIG. 5(s)). Subsequently, using a heretofore known ion implantation step, various kinds of diffusion step, an oxide film depositing step, and a wiring step, the lateral planar gate MOSFET is formed in lateral planar gate MOSFET region 22, and the vertical trench gate MOSFET is formed in vertical trench gate MOSFET region 21 (FIG. 5(t)). By so doing, the semiconductor device of the invention, formed of the vertical trench gate power IC shown in FIG. 1, is completed.

Figure 9:
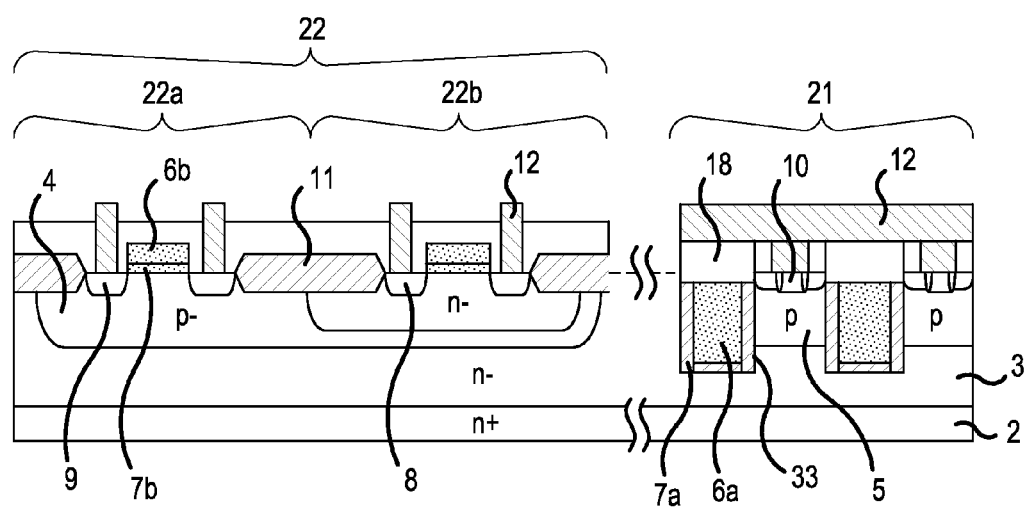
FIG. 9 is a sectional view showing main portions of another example of a vertical trench gate power IC manufactured using the semiconductor device manufacturing method according to Embodiment 3 of the invention.

Next, a description will be given of another example of the semiconductor device manufacturing method according to Embodiment 3 of the invention. FIG. 9 is a sectional view showing main portions of another example of a vertical trench gate power IC manufactured using the semiconductor device manufacturing method according to Embodiment 3 of the invention. A point wherein the vertical trench gate power IC shown in FIG. 9 differs from the vertical trench gate power IC shown in FIG. 1 is that p⁻ well region 4 is provided from lateral planar gate n-channel MOSFET region 22a to lateral planar gate p-channel MOSFET region 22b in a surface layer on n⁻ epitaxial semiconductor layer 3 side (hereafter referred to as the front surface) of the silicon substrate.

In lateral planar gate p-channel MOSFET region 22b, an n⁻ region is provided in p⁻ well region 4 so as to enclose p⁺ region 8. As the only difference from the manufacturing method of the vertical trench gate power IC shown in FIG. 1, described referring to FIG. 2 to FIG. 5, is the configuration when forming the diffusion layer (the p⁻ well region 4 and n⁻ region) of the control MOSFET, the vertical trench gate power IC shown in FIG. 9 is also the same with regard to the advantages of the invention.

In the description of Embodiment 3, the types of polysilicon films 6a and 6b deposited in the manufacturing steps (FIG. 3(h) and FIG. 5(r)) are not described in any particular detail, but each of polysilicon films 6a and 6b may be formed using either a doped polysilicon material or non-doped polysilicon material. In the heretofore described Embodiment 1, a vertical trench gate MOSFET is shown as the output stage MOS semiconductor device, but it is also possible to apply a lateral trench gate MOSFET as the output stage MOS semiconductor device. Also, in Embodiment 1, it is also possible to apply a high breakdown voltage lateral planar gate MOSFET as the control MOS semiconductor device.

As heretofore described, according to Embodiment 3, it is possible to obtain the same advantages as in Embodiments 1 and 2. According to Embodiment 3, it is possible after forming the trench to independently set the thicknesses of the first gate oxide film of the vertical trench gate MOSFET (output stage MOSFET) and second gate oxide film of the control MOSFET by adding a total of only three steps, two steps being the step of filling the trench with the polysilicon film and the step of forming the second gate oxide film, and one step being the polysilicon film photolithography step, while avoiding carrying out a photolithography step before filling the trench with the polysilicon film.

According to Embodiment 3, it is possible, by carrying out the step of forming the LOCOS oxide film after the step of forming the first gate oxide film of the vertical trench gate MOSFET, to prevent the thickness of the LOCOS oxide film from decreasing due to the pattern-etching for forming the first gate oxide film of the vertical trench gate MOSFET. Consequently, it is possible to further avoid the problems such as a drop in the gate threshold voltage of the inter-device parasitic field MOSFET or a drop in the device breakdown voltage that occur because the LOCOS oxide film is too thin.

According to Embodiment 3, it is possible to avoid carrying out the photolithography step in a condition in which there is nothing embedded in the trench by carrying out the step of forming the LOCOS oxide film after filling the trench with the polysilicon film, and thus possible to adopt manufacturing steps such that the resist does not enter the trench. Consequently, it is possible to solve the problem wherein residue of resist and the like remains in the narrow, deep trench, which is seen as a problem with the heretofore known manufacturing method.

According to each of the heretofore described embodiments, it is possible to independently set the thicknesses of the first gate oxide film of the vertical trench gate MOS semiconductor device (output stage MOS semiconductor device) and second gate oxide film of the control MOS semiconductor device, and to independently set the threshold voltage of each device. Because of this, it is possible to suppress an increase in the number of steps, and to realize a gate threshold voltage relationship wherein the gate threshold voltage of the output stage MOS semiconductor device is higher than the gate threshold voltage of the control MOS semiconductor device.

Heretofore, in each embodiment, the first conductivity type is taken to be an n-type and the second conductivity type a p-type, but the invention is established in the same way even when the first conductivity type is a p-type and the second conductivity type an n-type. Also, as the invention is such that it is sufficient that the first gate oxide film and second gate oxide film can be formed in isolated steps, the step of embedding the polysilicon film in the trench in order to form the gate electrode of the vertical trench gate MOS semiconductor device and the step of depositing the polysilicon film in order to form the gate electrode of the control MOS semiconductor device may be carried out in one step.

The semiconductor device manufacturing method according to the invention is useful in a power semiconductor device wherein a trench gate semiconductor device and planar gate semiconductor device are formed on the same semiconductor substrate. Many modifications and variations may be made to the techniques and structures described and illustrated herein without departing from the spirit and scope of the invention. Accordingly, it should be understood that the methods and devices described herein are illustrative only and are not limiting upon the scope of the invention.

What is claimed is:

1. A method of manufacturing a semiconductor device including a main semiconductor device portion having a first semiconductor region of a first conductivity type formed on a first main surface side of a first conductivity type semiconductor substrate, a second conductivity type semiconductor region selectively formed in a surface layer on a second main surface side of the first conductivity type semiconductor substrate, a second semiconductor region of a first conductivity type selectively formed in a surface layer of the second conductivity type semiconductor region, a trench penetrating from the surface of the second conductivity type semiconductor region through the second conductivity type semiconductor region and the second semiconductor region of the first conductivity type and reaching the first conductivity type semiconductor substrate, a first gate oxide film formed along the internal wall of the trench, and a gate electrode formed on the first gate oxide film inside the trench, a device isolation portion, selectively formed on the surface on the second main surface side of the first conductivity type semiconductor substrate, that has a selective oxide film of a thickness greater than that of the first gate oxide film, and a control semiconductor device portion that controls the main semiconductor device portion, having a well diffusion region of a second conductivity type formed in a surface layer of a portion on the second main surface side of the first conductivity type semiconductor substrate isolated from the main semiconductor device portion by the device isolation portion, a control gate electrode formed on a second gate oxide film on the surface of the second conductivity type well diffusion region, a first conductivity type control source region selectively formed in a surface layer of the second conductivity type well diffusion region, and a first conductivity type control drain region formed apart from the first conductivity type control source region in a surface layer of the second conductivity type well diffusion region, sandwiching a portion of the second conductivity type well diffusion region that opposes the control gate electrode, the semiconductor device manufacturing method comprising the following steps:

a trench formation step of forming the trench in the second main surface of the first conductivity type semiconductor substrate;

a first gate oxide film formation step of forming the first gate oxide film along the internal wall of the trench;

a gate electrode formation step of forming the gate electrode on the first gate oxide film inside the trench;

a selective oxide film formation step of selectively forming the selective oxide film on the second main surface of the first conductivity type semiconductor substrate;

a second gate oxide film formation step of forming the second gate oxide film of a thickness less than that of the first gate oxide film on the second main surface of the first conductivity type semiconductor substrate; and a control gate electrode formation step of forming the control gate electrode on the second gate oxide film, wherein the trench formation step, first gate oxide film formation step, gate electrode formation step, selective oxide film formation step, second gate oxide film formation step, and control gate electrode formation step are carried out in this order.

2. The semiconductor device manufacturing method according to claim 1, wherein the selective oxide film is a LOCOS oxide film.

3. The semiconductor device manufacturing method according to claim 1, wherein the device includes a vertical or lateral trench gate insulated gate field effect transistor in the main semiconductor device portion.

4. The semiconductor device manufacturing method according to claim 1, wherein the device includes a vertical or lateral trench gate insulated gate bipolar transistor in the main semiconductor device portion.

5. The semiconductor device manufacturing method according to claim 1, wherein the device includes a lateral planar gate insulated gate field effect transistor or lateral trench gate insulated gate field effect transistor in the control semiconductor device portion.

6. The semiconductor device manufacturing method according to claim 2, wherein the device includes a lateral planar gate insulated gate field effect transistor or lateral trench gate insulated gate field effect transistor in the control semiconductor device portion.

7. The semiconductor device manufacturing method according to claim 3, wherein the device includes a lateral planar gate insulated gate field effect transistor or lateral trench gate insulated gate field effect transistor in the control semiconductor device portion.

8. The semiconductor device manufacturing method according to claim 4, wherein the device includes a lateral planar gate insulated gate field effect transistor or lateral trench gate insulated gate field effect transistor in the control semiconductor device portion.

* * * * *